United States Patent [19]

Wang

[11] Patent Number: 4,991,142
[45] Date of Patent: Feb. 5, 1991

[54] DYNAMIC RANDOM ACCESS MEMORY WITH IMPROVED SENSING AND REFRESHING

[75] Inventor: Chen Y. Wang, San Jose, Calif.

[73] Assignee: Samsung Semiconductor Inc., San Jose, Calif.

[21] Appl. No.: 382,581

[22] Filed: Jul. 20, 1989

[51] Int. Cl.⁵ .................................................. G11C 7/00
[52] U.S. Cl. ...................................... 365/208; 365/149
[58] Field of Search ............... 365/149, 205, 207, 208, 365/210, 222

[56] References Cited

U.S. PATENT DOCUMENTS

| | | | |
|---|---|---|---|
| 4,658,877 | 4/1987 | McElroy | 365/149 |
| 4,811,802 | 3/1989 | Koishi | 365/222 |
| 4,816,706 | 3/1989 | Dhong et al. | 307/530 |
| 4,819,207 | 4/1989 | Sakui et al. | 365/222 |
| 4,819,209 | 4/1989 | Takemae et al. | 365/230.05 |
| 4,825,417 | 4/1989 | Seo | 365/205 |

Primary Examiner—Joseph A. Popek
Attorney, Agent, or Firm—Cushman, Darby & Cushman

[57] ABSTRACT

The present invention uses two pairs of cross coupled n-channel sense amplifier transistors attached between two electrically balanced halves of a bit line. Disposed between each pair of cross coupled n-channel sense amplifier transistors is only one pair of p-channel restore transistors attached between the bit line and complement bit line. Furthermore, on the bit line and complement bit line, between one pair of cross coupled n-channel sense amplifier transistors and the pair of p-channel restore transistors, are depletion type isolating transistors that further isolate halves of the bit line and complement bit line.

7 Claims, 2 Drawing Sheets

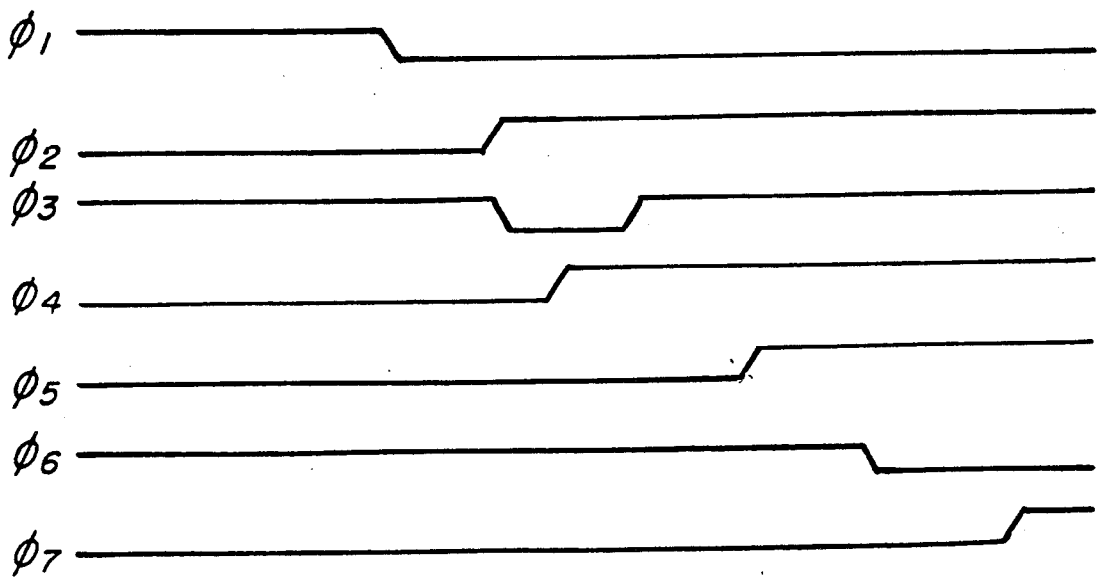
F I G. 2A
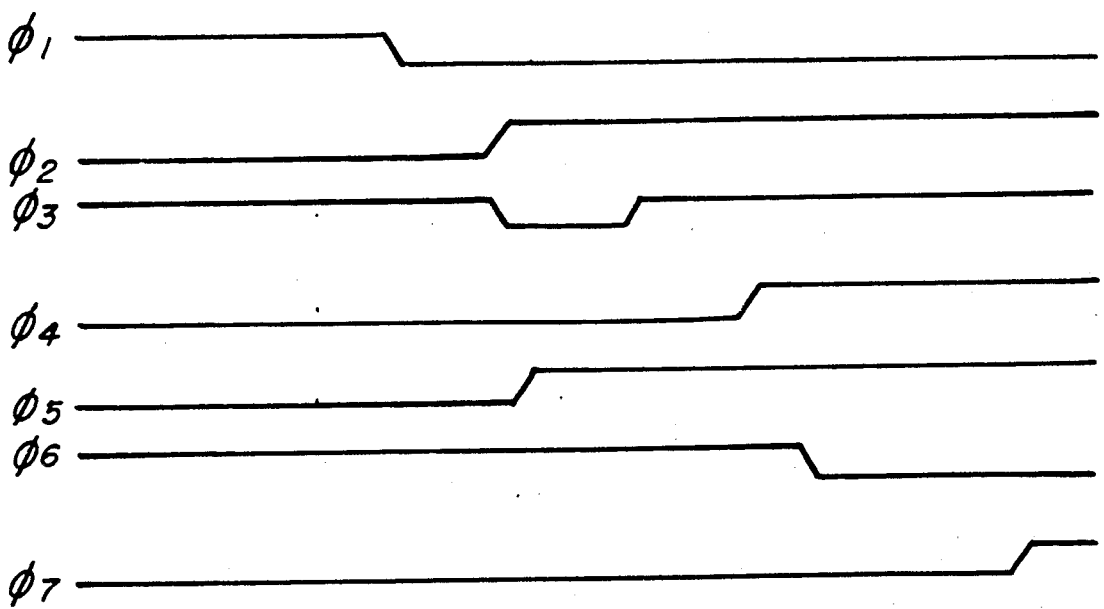
F I G. 2B

DYNAMIC RANDOM ACCESS MEMORY WITH IMPROVED SENSING AND REFRESHING

BACKGROUND OF THE INVENTION

1. The Field of the Art.

This invention relates to a dynamic random access memories (DRAMs) and, more particularly, to sensing and refreshing circuitry.

2. Description of the Prior Art.

DRAMS are widely used as memory storage devices. In one transistor memory storage cell DRAMs, data is read into and out from a storage capacitor, through a storage transistor, onto a bit line. A word line turns on the gate of the storage transistor to allow data read in and read out. A plurality of such cells are attached to each bit line.

As the memory storage capabilities of DRAMs have increased, the storage capacitors have become increasingly smaller and the number of one transistor memory cells attached to a single bit line have increased. Thus, there has been a need for more sensitive sensing amplifiers and accompanying refreshing circuitry.

U.S. Pat. No. 4,811,302, for example, uses a pair of sense amplifiers that operate simultaneously to improve the sensitivity of the sensing. Furthermore, during operation, only half of the bit line is attached to the sense amplifiers, thereby further reducing the capacitance of the bit line.

However, there still exists the need for developing sensing and refresh circuitry that reduces the dimensions of the DRAM chip, especially chip length.

SUMMARY OF THE INVENTION

It is an object of the present invention to provide sensing and refresh circuitry that reduces the dimensions of the DRAM chip considerably while still providing accurate sensing and refreshing operations.

It is another object of the present invention to provide sensing and refreshing circuitry in which two pairs of cross coupled sense amplifier transistors share one pair of cross coupled restoring transistors.

It is a further object of the present invention to reduce the capacitance of the bit lines during sensing.

In order to attain the above recited objects of the invention, among others, the present invention uses two pairs of cross coupled n-channel sense amplifier transistors attached between two electrically balanced halves of a bit line, each half being termed the bit line and complement bit line, respectively. Disposed between each pair of cross coupled n-channel sense amplifier transistors is a pair of p-channel restore transistors attached between the bit line and complement bit line. Furthermore, on the bit line and complement bit line, between one pair of cross coupled n-channel sense amplifier transistors and the pair of p-channel restore transistors, are depletion type isolating transistors that can further isolate halves of the bit line and complement bit line.

When sensing data from memory cells on the bit line or the associated complementary bit line, which form an electrically balanced memory array, data is read out and initially sensed using only one pair of cross coupled n-channel sense amplifier transistors. The depletion type isolating transistors, normally on, are turned off, thereby isolating the second pair of cross coupled n-channel sense amplifier transistors and disconnecting that half of the bit line and complement bit line, thereby decreasing the capacitance of the bit line.

Once the initial sensing begins, the depletion type isolating transistors resume their normally on state, and the second pair of cross coupled n-channel sense amplifier transistors senses the voltage difference between the bit line and complement bit line to further increase the speed of the sensing operation.

The following refresh operation then uses the pair of p-channel restore transistors to bring the whole bit line or complement bit line to the desired voltage level and allow the memory cell to be recharged.

BRIEF DESCRIPTION OF THE DRAWINGS

These and other advantages of the present invention may be appreciated from studying the following detailed description of the preferred embodiment together with the drawings in which:

FIG. 2A illustrates a timing diagram for a read and refresh operation from one half of the bit line and complement bit line according to the present invention; and FIG. 2B illustrates a timing diagram for a read and refresh operation from the opposite half of the bit line and complement bit line according to the present invention.

DETAILED DESCRIPTION OF THE PREFERRED EMBODIMENT

Figure 1:
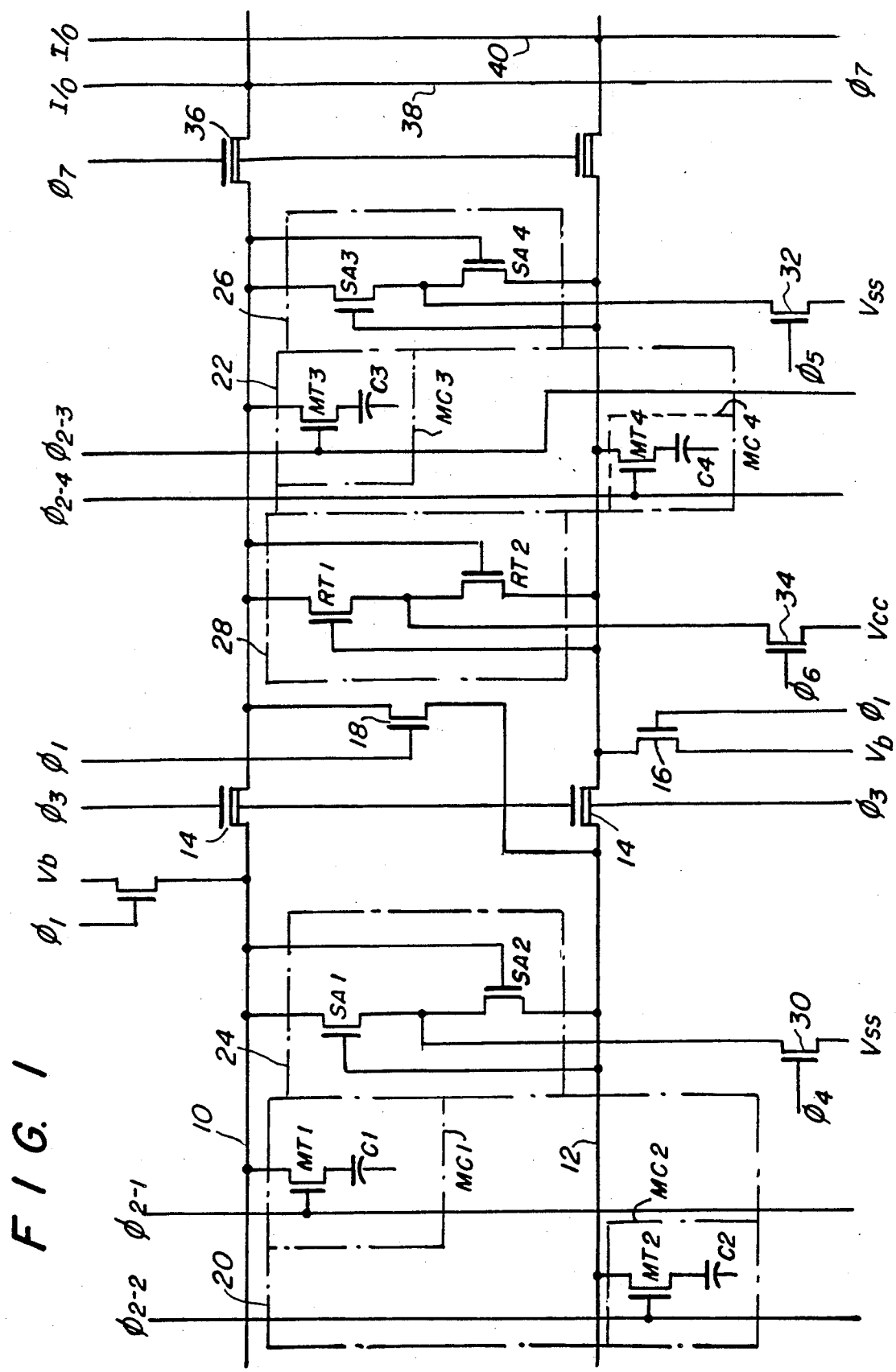
FIG. 1 schematically illustrates one embodiment of the present invention.

FIG. 1 illustrates a bit line 10 and complementary bit line 12, which combine to form one of a plurality of bit lines for a dynamic memory. Both bit line 10 and complementary bit line 12 are electrically balanced, adjacent, and parallel to each other. Bit line 10 and complementary bit line 12 are each further divided in half by an isolating transistor 14. Each isolating transistor 14 is a depletion type, normally on, MOS transistor. Isolating signal $\phi 3$ turns each isolating transistor 14 off.

Equalization transistors 16 further connect voltage vb, which is, for example, vcc/2, to bit line 10 and complementary bit line 12 to equalize the voltage on bit line 10 and complementary bit line 12. Transistor 18, which is connected between bit line 10 and complementary bit line 12 helps further equalize the voltage on bit line 10 and complementary bit line 12. Equalization signal $\phi 1$ turns on equalization transistors 16 and 18.

The memory cells are divided between each half of bit line 10 and complementary bit line 12 in memory array 20 and memory array 22. In both memory array 20 and memory array 22, each memory cell contains a storage transistor and storage capacitor (memory cells MC1-4, each containing storage transistors MT1-4, and storage capacitors C1-4, respectively, are illustrated). FIG. 1 only illustrates one memory cell connected to each half of bit line 10 and half of complementary bit line 12 through showing memory cells MC1-MC4. The word line address is also connected to the gates of storage transistors for application of word line address signals $\phi 2$-1 to $\phi 2$-4 for those illustrated memory cells. One data bit is then capable of being stored in each of storage capacitors C1-4.

On one half and between bit line 10 and complementary bit line 12 is connected sense amplifier 24 and on the opposite half and between bit line 10 and complementary bit line 12 is connected sense amplifier 26. Sense amplifier 24 contains sense amplifier transistors SA1 and SA2, and sense amplifier 26 contains sense amplifier transistors SA3 and SA4, respectively, which are n-channel, cross coupled transistors. The cross coupled source regions of sense amplifier transistor SA1 and sense amplifier transistor SA2 of sense amplifier 24 are connected to vss through enabling transistor 30. The cross coupled source regions of sense amplifier transistor SA3 and sense amplifier transistor SA4 of sense amplifier 26 are connected to vss through enabling transistor 32. Enabling transistors 30 and 32 are turned on by application of sense enable signals $\phi 4$ and $\phi 5$, respectively.

Between bit line 10 and complementary bit line 12 is a single restore circuit 28, which consists of a pair of restore transistors RT1 and RT2, which are p-channel, cross coupled, transistors. The cross coupled source regions of each restore transistor RT1 and RT2 are connected to vcc through enabling transistor 34, which is turned on by restoring signal $\phi 6$. Restore circuit 28 can be located at any point along bit line 10 and complementary bit line 12 as long as column select transistors 36, described hereinafter, are not located between restore circuit 28 and the sense amplifiers 24 and 26 and memory cell arrays 20 and 22. FIG. 1 illustrates restore circuit 28 located between sense amplifier 24 and memory cell array 22.

Further, attached to bit line 10 and complementary bit line 12 are a plurality of column select transistors 36, which are enhancement mode MOS transistors that are turned on during read operations by column select signal $\phi 7$. When on, data on each bit line 10 and complementary bit line 12 is transferred to input/output data bus 38 and complement input/output data bus 40.

Operation of the above described circuit will now be described using FIG. 2A.

Initially, storage transistors MT1-4, sense amplifier transistors SA1-SA4, restoring transistors RT1 and RT2, column select transistors 36, enabling transistors 30 and 32, and equalization transistors 16 and 18 are in an off state and normally on transistors isolating transistor 14 are in their normally on state.

For purposes of illustration, it will be assumed that storage capacitor 1 is charged to a "1" level and needs refreshing.

At the beginning of a read or refresh operation, both bit line 10 and complementary bit line 12 are charged to some voltage vb, which is typically vcc/2, by turning on equalization transistors 16 and 18 with equalization signal $\phi 1$. Once bit line 10 and complementary bit line 12 are charged to the same voltage vb, equalization signal $\phi 1$ turns off and the equalization is complete. Word line address signal $\phi 2$-1 and isolating signal $\phi 3$ then follow. Isolating signal $\phi 3$ disconnects the half of bit line 10 and complementary bit line 12 to the right of each isolating transistor 14, including sense amplifier 26, which reduces the bit line capacitance of bit line 10 and complementary bit line 12. The application of word line address signal $\phi 2$-1 to the gate of storage transistor MT1 allows the charge stored on storage capacitor C1 to be placed on bit line 10, which voltage then slightly increases.

While isolating signal $\phi 3$ is still being applied to turn off isolating transistors 14, enabling signal $\phi 4$ is applied, which turns on enabling transistor 30 and provides a conductive path to ground from the sources of sense amplifier transistor SA1 and sense amplifier transistor SA2. Because the gate of sense amplifier transistor SA2, which is connected to bit line 10, will have a slightly larger voltage than the gate of sense amplifier transistor SA1, which is connected to complementary bit line 12, sense amplifier transistor SA2 will conduct and begin to lower the voltage on complementary bit line 12 and not bit line 10.

Once this begins, isolating signal $\phi 3$ is turned off so that isolating transistors 14 return to their normally on state, and the voltage on complementary bit line 12 and bit line 10 is then applied to the gates of sense amplifier transistors SA3 and SA4, respectively. Because the voltage of bit line 10 is higher than that of complementary bit line 12, sense amplifier transistor SA4 will conduct and, along with sense amplifier transistor SA2, quickly bring complementary bit line 12 to ground potential.

With the voltage of bit line 10 being slightly less than vb and the voltage of complementary bit line 12 being approximately ground potential, the application of enabling signal $\phi 6$ connects voltage vcc to the sources of restore transistors RT1 and RT2. This will cause charging of bit line 10 through restore transistor RT1, which is turned on because it has a lower gate potential than restore transistor RT2. This then allows for the recharging of storage capacitor C1 to a "1" level and also, if desired, for the application of column select signal $\phi 7$ so that the data from storage capacitor C1 can be read onto input/output data bus 38.

FIG. 2B illustrates the timing associated with the same operation when data from either storage capacitors C3 or C4 are being refreshed and read. It will be appreciated that the sequence of events is identical, except that the timing of enabling signal $\phi 4$ and enabling signal $\phi 5$ is reversed and one of word line address signals $\phi 2$-3 or $\phi 2$-4 are used rather than word line address signals $\phi 2$-1 or $\phi 2$-2.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

I claim:

1. A sense and restore circuit for a dynamic memory containing first and second memory cell arrays, each memory cell array having a plurality of memory cells attached to a bit line and complement bit line, each memory cell containing a storage capacitor for storing data and a storage transistor for transferring said data upon receipt of a word line address signal to either said bit line or said complement bit line, said sense and restore circuit comprising:

sensing means connected between said bit line and said complement bit line for sensing said data from one of said memory cells after receipt of said word address signal, said sensing means comprising:
a first pair of cross coupled n-channel transistors disposed between said first and second memory cell arrays and connected between said bit line and said complement bit line that are enabled with a first sensing signal, and
a second pair of cross coupled n-channel transistors connected between said bit line and said complement bit line that are enabled with a second sensing signal; and restoring means connected between said bit line and said complement bit line for restoring said data in said one memory cell upon receipt of a restoring signal that follows said second sensing signal, said restoring means comprising only one pair of cross coupled p-channel transistors connected between said bit line and said complement bit line.

2. A sense and restore circuit according to claim 1 further comprising:
   means disposed between said first and second pair of cross coupled n-channel transistors and between said first and second memory cell arrays for isolating said first pair of cross coupled n-channel transistors and said first memory cell array from said second pair of cross coupled n-channel transistors and said second memory cell array for a period lasting from receipt of said word line address signal to a time prior to receipt of said restoring signal.

3. A sense and restore circuit according to claim 2 wherein said isolating means comprises a plurality of depletion transistors attached to said bit line and said complement bit line.

4. A sense and restore circuit according to claim 2 wherein said first sensing signal occurs during said period and said second sensing signal occurs after said period but prior to said restoring signal.

5. A sense and restore circuit for a dynamic memory containing first and second memory cell arrays, each memory cell array having a plurality of memory cells attached to a bit line and complement bit line, each memory cell containing a storage capacitor for storing data and a storage transistor for transferring said data upon receipt of a word line address signal to either said bit line or said complement bit line, said sense and restore circuit comprising:
   sensing means connected between said bit line and said complement bit line for sensing said data from one of said memory cells after receipt of said word address signal, said sensing means comprising:
      a first pair of cross coupled n-channel transistors disposed between said first and second memory cell arrays and connected between said bit line and said complement bit line, and
      a second pair of cross coupled n-channel transistors connected between said bit line and said complement bit line; and
   restoring means connected between said bit line and said complement bit line for restoring said data in said one memory cell upon receipt of a restoring signal that follows said word address signal, said restoring means comprising only one pair of cross coupled p-channel transistors connected between said bit line and said complement bit line.

6. A sense and restore circuit according to claim 5 further comprising:
   means disposed between said first and second pair of cross coupled n-channel transistors and between said first and second memory cell arrays for isolating said first pair of cross coupled n-channel transistors and said first memory cell array from said second pair of cross coupled n-channel transistors and said second memory cell array for a period lasting from receipt of said word line address signal to a time prior to receipt of said restoring signal.

7. A sense and restore circuit according to claim 6 wherein said isolating means comprises a plurality of depletion transistors attached to said bit line and said complement bit line.

* * * * *